(12) United States Patent
Ping et al.

(10) Patent No.: US 7,579,232 B1
(45) Date of Patent: Aug. 25, 2009

(54) METHOD OF MAKING A NONVOLATILE MEMORY DEVICE INCLUDING FORMING A PILLAR SHAPED SEMICONDUCTOR DEVICE AND A SHADOW MASK

(75) Inventors: Er-Xuan Ping, Fremont, CA (US);
Randhir Thakur, Fremont, CA (US);
Klaus Scheugraf, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 12/216,924

(22) Filed: Jul. 11, 2008

(51) Int. Cl.
*H01L 21/8234* (2006.01)
*H01L 21/8222* (2006.01)
*H01L 21/425* (2006.01)

(52) U.S. Cl. .................... 438/237; 438/328; 438/531

(58) Field of Classification Search ............ 438/237, 438/328, 531; 257/458, 646, E27.02, E27.022, 257/27.031, E27.039; 148/DIG. 143
See application file for complete search history.

(56) References Cited

U.S. PATENT DOCUMENTS

| | | | |
|---|---|---|---|
| 5,780,908 A | 7/1998 | Sekiguchi et al. | |
| 5,915,167 A | 6/1999 | Leedy | |
| 6,034,882 A | 3/2000 | Johnson et al. | |
| 6,083,787 A | 7/2000 | Lee | |
| 6,133,149 A | 10/2000 | Yeh | |
| 6,420,215 B1 | 7/2002 | Knall et al. | |
| 6,525,953 B1 | 2/2003 | Johnson | |
| 6,952,043 B2 | 10/2005 | Vyvoda et al. | |
| 7,238,607 B2 | 7/2007 | Dunton | |
| 7,285,464 B2 | 10/2007 | Herner et al. | |
| 2002/0022361 A1* | 2/2002 | Kim et al. ............ | 438/638 |
| 2004/0137721 A1 | 7/2004 | Lim et al. | |
| 2005/0052915 A1 | 3/2005 | Herner et al. | |
| 2006/0189077 A1 | 8/2006 | Herner et al. | |
| 2006/0249753 A1 | 11/2006 | Herner et al. | |
| 2006/0292301 A1 | 12/2006 | Herner | |
| 2007/0164309 A1 | 7/2007 | Kumar et al. | |
| 2007/0284656 A1 | 12/2007 | Radigan et al. | |

OTHER PUBLICATIONS

U.S. Appl. No. 11/819,078, filed Jun. 25, 2007, Herner.
U.S. Appl. No. 11/864,205, filed Sep. 28, 2007, Chen et al.

* cited by examiner

*Primary Examiner*—William M. Brewster
(74) *Attorney, Agent, or Firm*—Foley & Lardner LLP

(57) ABSTRACT

A method of making a semiconductor device includes forming a pillar shaped semiconductor device surrounded by an insulating layer such that a contact hole in the insulating layer exposes an upper surface of the semiconductor device. The method also includes forming a shadow mask layer over the insulating layer such that a portion of the shadow mask layer overhangs a portion of the contact hole, forming a conductive layer such that a first portion of the conductive layer is located on the upper surface of the semiconductor device exposed in the contact hole and a second portion of the conductive layer is located over the shadow mask layer, and removing the shadow mask layer and the second portion of the conductive layer.

20 Claims, 4 Drawing Sheets

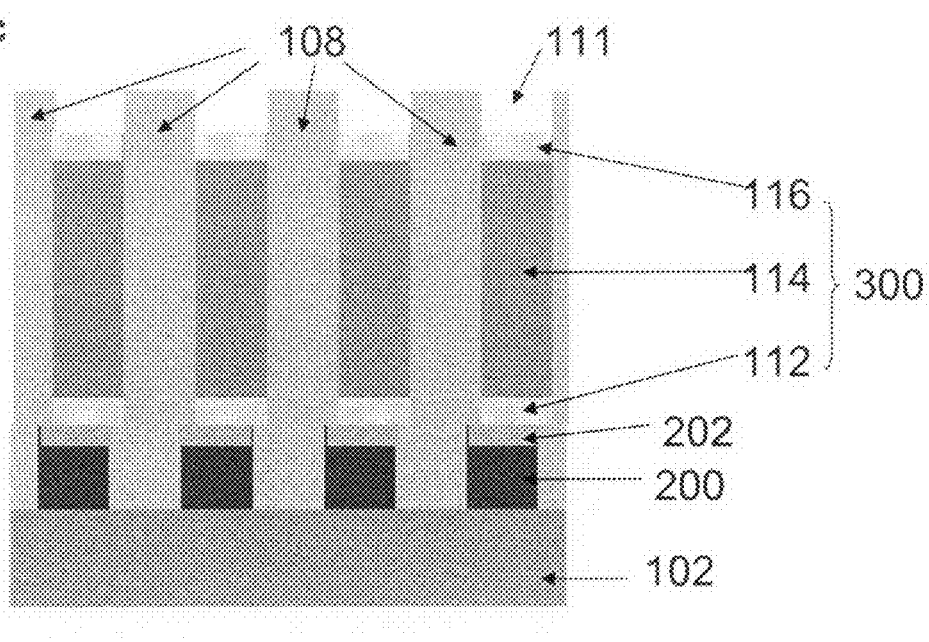

METHOD OF MAKING A NONVOLATILE MEMORY DEVICE INCLUDING FORMING A PILLAR SHAPED SEMICONDUCTOR DEVICE AND A SHADOW MASK

FIELD OF THE INVENTION

The present invention relates generally to the field of semiconductor device processing, and specifically to a method of making a nonvolatile memory device.

BACKGROUND

Herner et al., U.S. patent application Ser. No. 10/955,549 filed Sep. 29, 2004 (which corresponds to US Published Application 2005/0052915 A1), hereby incorporated by reference, describes a three dimensional memory array in which the data state of a memory cell is stored in the resistivity state of the polycrystalline semiconductor material of a pillar shaped semiconductor junction diode. A subtractive method is used to fabricate such pillar diode devices. This method includes depositing one or more silicon, germanium or other semiconductor material layers. The deposited semiconductor layer or layers are then etched to obtain semiconductor pillars. A $SiO_2$ layer can be used as a hard mask for the pillar etching and removed afterwards. Next, $SiO_2$ or other gap fill dielectric material is deposited in between and on top of the pillars. A chemical mechanical polishing (CMP) or etchback step is then conducted to planarize the gap fill dielectric with the upper surface of the pillars.

For additional description of the subtractive pillar fabrication process, see Herner et al., U.S. patent application Ser. No. 11/015,824, "Nonvolatile Memory Cell Comprising a Reduced Height Vertical Diode," filed Dec. 17, 2004 and U.S. patent application Ser. No. 11/819,078 filed Jul. 25, 2007. However, in the subtractive method, the height of the semiconductor pillar may be limited by thin and soft photoresist used as the etching mask. The photoresist mask material etches at a slower rate than the semiconductor material, but etches nonetheless, and some mask material must remain when the semiconductor etch is completed. The oxide gap filling step after pillar etch presents a processing challenge when the aspect ratios of the openings between the pillars increases and/or the CMP process or etchback of the gap fill layer removes a significant thickness of the deposited semiconductor material. Finally, as the pillar size the decreases, the mechanical strength of the pillar formed by the substrative method also decreases.

SUMMARY

One embodiment of this invention provides a method of making a semiconductor device which comprises forming a pillar shaped semiconductor device surrounded by an insulating layer such that a contact hole in the insulating layer exposes an upper surface of the semiconductor device. The method further comprises forming a shadow mask layer over the insulating layer such that a portion of the shadow mask layer overhangs a portion of the contact hole, forming a conductive layer such that a first portion of the conductive layer is located on the upper surface of the semiconductor device exposed in the contact hole and a second portion of the conductive layer is located over the shadow mask layer, and removing the shadow mask layer and the second portion of the conductive layer.

BRIEF DESCRIPTION OF THE DRAWINGS

FIGS. 1a to 1h are side cross-sectional views illustrating stages in formation of a pillar device according to an embodiment of the present invention.

DETAILED DESCRIPTION OF THE EMBODIMENTS

One embodiment of the invention provides a method of making a semiconductor device by forming a pillar shaped semiconductor device surrounded by an insulating layer such that a contact hole in the insulating layer exposes an upper surface of the semiconductor device. Preferably but not necessarily, the step of forming the pillar shaped semiconductor device includes selectively depositing a semiconductor material into an opening in the insulating layer such that a lower portion of opening is filled with the semiconductor material and an unfilled upper portion of the opening forms the contact hole. Then, a shadow mask layer is formed over the insulating layer such that a portion of the shadow mask layer overhangs a portion of the contact hole. Preferably but not necessarily, the step of forming the shadow mask layer includes depositing an insulating shadow mask layer with poor step coverable by PECVD, where the insulating shadow mask layer has a different composition from a composition of the insulating layer. Then, a conductive layer is formed such that a first portion of the conductive layer is located on the upper surface of the semiconductor device exposed in the contact hole and a second portion of the conductive layer is located over the shadow mask layer. The method also includes removing the shadow mask layer and the second portion of the conductive layer.

The pillar device may comprise a portion of any suitable semiconductor device, such as a diode, transistor, etc. Preferably, the pillar device comprises a diode, such as a p-i-n diode. The diode preferably comprises a steering element of a nonvolatile memory device. As will be described in more detail below, a resistivity switching element is also formed in the contact hole over the first portion of the conductive layer. An upper electrode is formed over the switching element. Since the conductive layer is formed using the shadow mask, the first portion of the conductive layer located on the bottom of the contact hole does not extend along a sidewall of the contact hole. Thus, the conductive layer does not create short to the upper electrode.

FIGS. 1a through 1i show a preferred method of forming the pillar device.

Figure 1A:
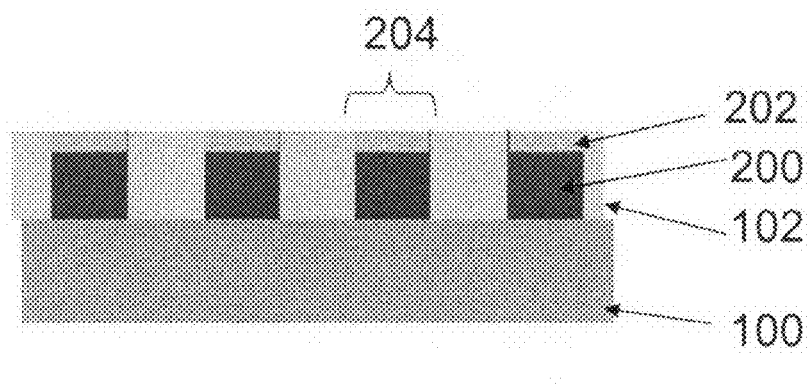

Referring to FIG. 1a, the device is formed over a substrate 100. The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as glass, plastic, metal or ceramic substrate. The substrate may include integrated circuits fabricated thereon, such as CMOS based driver circuits for a memory device. An insulating layer 102 is preferably formed over substrate 100 and over any driver circuits formed on the substrate. The insulating layer 102 can be silicon oxide, silicon nitride, high-dielectric constant film, Si—C—O—H film, or any other suitable insulating material.

A first electrically conductive layer 200 is formed over the substrate 100 and insulating layer 102. The conductive layer 200 can comprise any conducting material known in the art, such as tungsten and/or other materials, including aluminum, tantalum, titanium, copper, cobalt, or alloys thereof. An optional adhesion layer, such as a TiN, Ti and/or Ta layer, may be included between the insulating layer 102 and the conductive layer to help conductive layer adhere to insulating layer 102. For example, a Ta adhesion layer may be used for a Cu conductive layer, while a TiN or Ti adhesion layer may be used for a W or Al conductive layer.

A barrier layer 202, such as a Ta, Ti, WN, TaN or TiN layer is formed on top of the first conductive layer 200. If upper surface of the first conductive layer 200 is tungsten, then tungsten nitride can be formed on top of the conductive layer 200 instead of TiN by nitriding the upper surface of the tungsten. TiN or Ti may be used as a barrier layer 202 for a W or Al conductive layer 200, while a Ta barrier layer 202 may be used for a Cu conductive layer 200. For example, the following conductive layer combinations may be used: Ti (bottom)/Al/TiN (top), or Ti/TiN/Al/TiN, or Ti/Al/TiW, or any combination of these layers. The bottom Ti or Ti/TiN layers can act as adhesion layers, the Al layer can act as the conductive layer 200, and the TiN or TiW layer on top can serve as the barrier layer 202 as well as an antireflective coating for patterning the electrodes 204, as an optional polish stop material for subsequent CMP of an insulating layer 108, and as a selective semiconductor seed deposition substrate, as will be described below.

Finally, the conductive layer 200 and the barrier layer 202 are patterned using any suitable process. The conductive layer 200 and the barrier layer 202 may be patterned into rail shaped bottom electrodes 204 of memory devices. For example, the electrodes 204 may instead be formed by a Damascene method, in which at least the conductive layer 200 is formed in grooves in the insulating layer 102 and over the upper surface of the insulating layer 102 by any suitable deposition method, such as by sputtering or MOCVD. A subsequent planarization step, such as a chemical mechanical polishing (CMP) step, removes the conductive layer 200 from the upper surface of the insulating layer 102 to leave the conductive material, such as Cu, Al or W in the grooves in the insulating layer 102. The conductive layer 200 is then recessed in the grooves below the upper surface in the insulating layer 102 by selective etching. The barrier layer 202 is then formed in the grooves in the insulating layer 102 over the recessed conductive layer 200 exposed in the grooves and over the upper surface of the insulating layer 102. The barrier layer 202 is subsequently planarized by CMP such that the barrier layer 202 remains on the portions of the conductive layer 200 in the grooves in layer 102 to complete the lower electrodes 204. Alternatively, the conductive layer 200 and the barrier layer 202 may be deposited sequentially over the upper surface insulating layer 102 and in the grooves in the insulating layer 102 followed by a single CMP planarization step to form the electrodes 204. The resulting structure is shown in FIG. 1a.

Alternatively, the electrodes 204 may be formed by patterning and etching process rather than by the damascene process. In this case, layers 200 and 202 are deposited sequentially over a flat surface, a photoresist layer is deposited over the barrier layer 202, the photoresist layer is patterned by photolithography, and the layers 200 and 202 are then etched using the patterned photoresist layer as a mask to form the lower electrodes 204. The photoresist layer is then removed using standard process techniques. An insulating layer is formed around the lower electrodes 204.

Figure 1B:
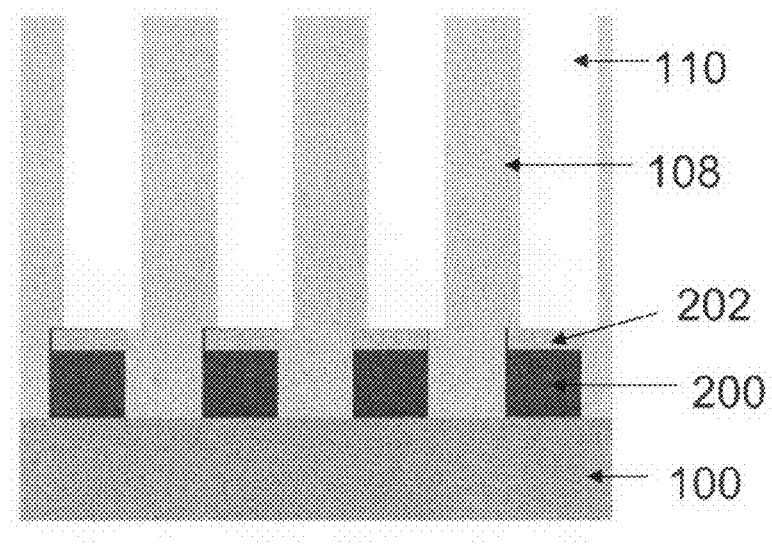

Next, turning to FIG. 1b, an insulating layer 108 is deposited over the electrodes 204. The insulating layer 108 can be any electrically insulating material, such as silicon oxide, silicon nitride, silicon oxynitride or other organic or inorganic high dielectric constant insulating materials. The insulating layer 108 may be planarized by CMP for a desired amount of time to obtain a planar surface.

The insulating layer 108 is then photolithographically patterned to form openings 110 extending to and exposing the upper surface of the barriers 202 of the electrodes 204. The openings 110 should have about the same pitch and about the same width as the electrodes 204 below, such that each semiconductor pillar 300 (as will be described below with respect to FIG. 1c) is formed on top of a respective electrode 204. Some misalignment can be tolerated. The resulting structure is shown in FIG. 1b.

Referring to FIG. 1c, vertical semiconductor pillars 300 are formed in the openings 110 above the barrier 202 portions of each electrodes 204. The semiconductor material of the pillars can be silicon, germanium or a silicon-germanium alloy, such as germanium rich silicon germanium. Other semiconductor materials, such as silicon carbide, Group III-V materials, such as GaAs, GaN, etc. and Group II-VI materials, such as ZnSe, CdTe, etc., may also be used depending on the desired end use for the pillar device 300. The semiconductor material may be polycrystalline, amorphous or single crystalline, depending on deposition conditions, subsequent crystallization annealing, etc.

Preferably, the semiconductor material of the pillars 300 is selectively deposited into the openings 110 in the insulating layer 108. For example, germanium pillars 300 can be selectively deposited by low pressure chemical vapor deposition (LPCVD) selectively on a thin Si seed layer located over TiN barriers, as shown in FIG. 1c. For example, the method described in U.S. application Ser. No. 11/159,031 filed on Jun. 22, 2005 (which published as US Published Application 2006/0292301 A1) and in U.S. application Ser. No. 12/007,780 filed on Jan. 15, 2008, both incorporated herein by reference in their entirety, may be used to deposit the Ge pillars. Preferably, the entire pillar 300 is selectively deposited. However, in a less preferred embodiment, only about the first 20 nm of the pillar 300 deposited on the seed layer/TiN barrier needs to have high selectivity versus silicon dioxide to prevent sidewall shorting of the diode, while the remainder of the pillar can be non-selectively deposited.

For example, a thin Si seed layer can be deposited on TiN by flowing 500 sccm of $SiH_4$ for 60 min at 380° C. and a pressure of 1 Torr. Silane flow is then halted, and 100 sccm of $GeH_4$ is flowed at the same temperature and pressure to deposit Ge. Ge may be deposited at a temperature below 380° C., such as 340° C. for example. After a 10 minute deposition, about 40 nm of germanium can be selectively deposited on the Si seed layer located on a TiN layer. By using a two step deposition with both steps conducted at a temperature of 380° C. or less, Ge can be selectively deposited on TiN and not on adjacent $SiO_2$ surfaces. An example of a two step deposition of a planar Ge film is described in S. B. Herner, *Electrochemical and Solid-State Letters*, 9 (5) G161-G163 (2006), which is incorporated herein by reference. Preferably, the silicon seed layer is deposited at a temperature below 440° C. and the germanium pillar is deposited at a temperature below 400° C. Other similar selective deposition methods may be used for silicon (such as polysilicon or amorphous silicon) or other semiconductor materials. A remote plasma CVD process may be used to decrease the deposition temperature.

Preferably, the semiconductor pillars 300 partially fill each opening 110. In other words, a lower portion of each opening 110 is selectively filled with the semiconductor material of a respective pillar 300, while an unfilled upper portion of the opening 110 remains as a contact hole 111 in which an upper portion of the respective pillar 300 is exposed.

Alternatively, the pillars 300 may be formed by non-selective deposition. For example, the pillars 300 may be formed by a damascene-type process in which the semiconductor material of the pillars is formed in the openings 110 and over the upper surface of the insulating layer 108. The semiconductor material is then planarized by etchback or CMP to leave the semiconductor pillars 300 located in the openings. If CMP planarization is used, then a subsequent recess etch, such as a polysilicon or polycrystalline germanium selective wet etch, may be used to selectively recess the semiconductor pillars 300 in the openings 110 to form the contact holes 111. A damascene-type pillar formation method is described in U.S. application Ser. No. 12/007,781 filed on Jan. 15, 2008 and incorporated herein by reference in its entirety.

In another alternative process, the pillars 300 may be formed by patterning and etching. In this method one or more semiconductor layers are formed over the electrodes 204. The semiconductor layer(s) are then photolithographically patterned into pillars 300. An insulating layer 108 is then formed around the pillars 300. If desired, a subsequent recess etch may be used to selectively recess the semiconductor pillars 300 in the openings 110 to form the contact holes 111.

In preferred embodiments, the pillars 300 comprise semiconductor junction diodes. The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have p-type semiconductor material and n-type semiconductor material in contact, such as Zener diodes, and p-i-n diodes, in which intrinsic (undoped) semiconductor material is interposed between p-type semiconductor material and n-type semiconductor material.

Bottom heavily doped region 112 of the diode 300 can be formed by selective deposition and doping. The semiconductor material can be deposited and then doped, but is preferably doped in situ by flowing a dopant containing gas providing n-type dopant atoms, for example phosphorus (i.e., in the form of phosphine gas added to the germane gas) during selective CVD of silicon or germanium. Heavily doped region 112 is preferably between about 10 and about 80 nm thick.

Intrinsic diode region 114 can then be formed by the selective CVD method. The intrinsic region 114 deposition can be conducted during a separate CVD step or by turning off the flow of the dopant gas, such as phosphine, during the same CVD step as the deposition of region 112. The intrinsic region 114 may be between about 110 and about 330 nm, preferably about 200 nm thick. An optional CMP process can then be conducted to remove any bridged intrinsic semiconductor material on top of the insulating layer 108, and to planarize the surface preparing for the following lithography step. The p-type top region 116 is then formed by the selective CVD method. The p-type top region 116 deposition can be conducted during a separate CVD step from the region 114 deposition step, or by turning on the flow of the dopant gas, such as boron trichloride, during the same CVD step as the region 114 deposition step. The p-type region 116 may be between about 10 and about 80 nm thick. An optional CMP process can then be conducted to remove any bridged p-type semiconductor on top of the insulating layer 108, and to planarize the surface preparing for the following lithography step.

Alternatively, the p-type region 116 may be formed by ion implantation into the upper region of the intrinsic region 114. The p-type dopant is preferably boron or $BF_2$. A remote plasma assisted process may be used to active the dopants during deposition. The formation of the p-type region 116 completes formation of pillar shaped diodes 300. The resulting structure is shown in FIG. 1c.

In the illustrative example, the bottom region 112 is $N^+$ (heavily doped n-type), and the top region 116 is $P^+$. However, the vertical pillar can also comprise other structures. For example, the bottom region 112 can be $P^+$ and the top region 116 can be $N^+$. In addition, the middle region can intentionally be lightly doped, or it can be intrinsic, or not intentionally doped. An undoped region will never be perfectly electrically neutral, and will always have defects or contaminants that cause it to behave as if slightly n-doped or p-doped. Such a diode can be considered a p-i-n diode. Thus, a $P^+/N^-/N^+$, $P^+/P^-/N^+$, $N^+/N^-/P^+$ or $N^+/P^-/P^+$ diode can be formed.

The pitch and width of the pillars 300 are defined by the openings 110, and can be varied as desired. In one preferred embodiment, the pitch of the pillars (the distance from the center of one pillar to the center of the next pillar) is about 300 nm, while the width of a pillar varies between about 100 and about 150 nm. In another preferred embodiment, the pitch of the pillars is about 260 nm, while the width of a pillar varies between about 90 and 130 nm. In general, the pillars 300 preferably have a substantially cylindrical shape with a circular or roughly circular cross section having a diameter of 250 nm or less.

Figure 1D:
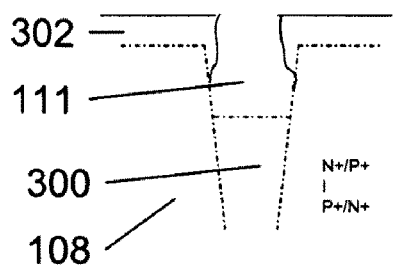

FIG. 1d illustrates the next step in the device fabrication method. A shadow mask layer 302 is formed over the insulating layer 108 such that a portion of the shadow mask layer overhangs a portion of the opening 110 in the insulating layer 108 (i.e., the peripheral portion of the contact hole 111 portion of opening 110). The shadow mask layer 302 is preferably an insulating layer with poor step coverage which overhangs the contact hole 111. Layer 302 should have a different composition from the composition of the insulating layer 108. For example, if the insulating layer 108 is silicon oxide, then the shadow mask layer 302 may be a silicon nitride or BPSG layer formed by plasma enhanced chemical vapor deposition (PECVD) with poor step coverage. A chemical wet clean can be used to enhance the shadowing feature further. This feature can also be achieved by an adjusted dry etch process where the top contact hole profile has a bow shape to shadow the subsequent PVD directional deposition of the conductive layer. In other words, the sidewall(s) of the contact hole 111 has a concave shape.

Figure 1E:
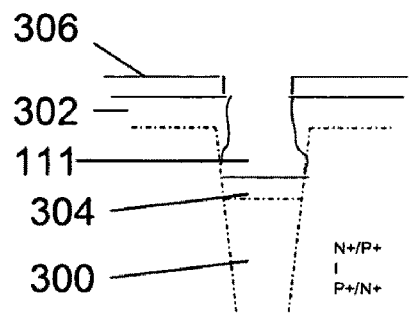

Then, as shown in FIG. 1e, a conductive layer is formed, such that a first portion 304 of the conductive layer is located on the upper surface of the pillar device 300 exposed in the contact hole 111 and a second portion 306 of the conductive layer is located over the shadow mask layer 302. The conductive layer may comprise any one or more conductive materials, such as titanium nitride, titanium, copper, aluminum, tungsten, tantalum, etc. TiN is preferred. The conductive layer may be deposited by any suitable method, such as sputtering or other physical vapor deposition (PVD) method.

Figure 1F:
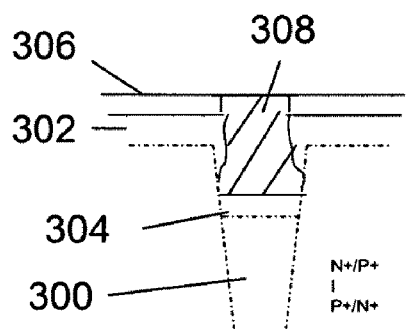

Then, as shown in FIG. 1f, the contact hole 111 portion of the opening 110 is filled with a flowable material 308 after the step shown in FIG. 1e. The flowable material 308 may comprise any organic or inorganic filler material or resist that can be used to prevent pattern collapse during a subsequent CMP step. For example, the flowable material 308 may be deposited by spin-on deposition or other similar method such that the material 308 selectively settles into the contact holes 111 and has an upper surface which is relatively level with the upper surface of the second portion 306 of the conductive layer.

The shadow mask layer 302 and the second portion 306 of the conductive layer are then removed by any suitable method, such as CMP and/or etchback. CMP is preferred. The CMP process stops when the upper surface of the insulating layer 108 is reached. The flowable material 308 prevents the collapse of the shadow mask layer 302 and second portion 306 of the conductive layer into the contact hole 111 during the CMP. Alternatively, a lift-off process may be used to remove shadow mask layer 302 and the second portion 306 of the conductive layer. In this process, the shadow mask layer 302 is selectively removed or etched to lift-off the second portion 306 of the conductive layer. In this case, layer 302 may comprise a photoresist layer. However, care should be taken to avoid resist contamination when using a resist layer as the shadow mask layer.

Figure 1G:
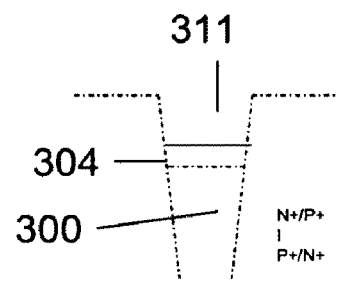

After removal of layer 302 and portion 306 of the conductive layer, the flowable material 308 is then removed from the contact hole after the CMP step, as shown in FIG. 1g. The flowable material 308 may be removed by selective etching or plasma stripping (if material 308 is a resist). Alternatively, if material 308 is a low temperature material, then it may be removed by heating to evaporate or liquefy this material.

In some embodiments, the first portion 304 of the conductive layer may function as an upper electrode. In this case, the removal of the flowable material 308 completes the process and the completed device is shown in FIG. 1g. However, in a preferred embodiment, the first portion 304 of the conductive layer comprises an intermediate conductive layer located between a steering and resistivity switching elements of a nonvolatile memory device.

Figure 1H:
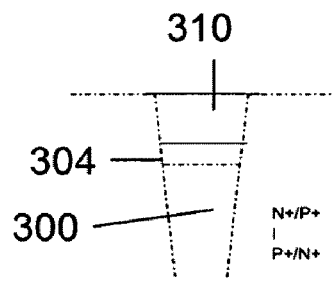
Figure 1I:
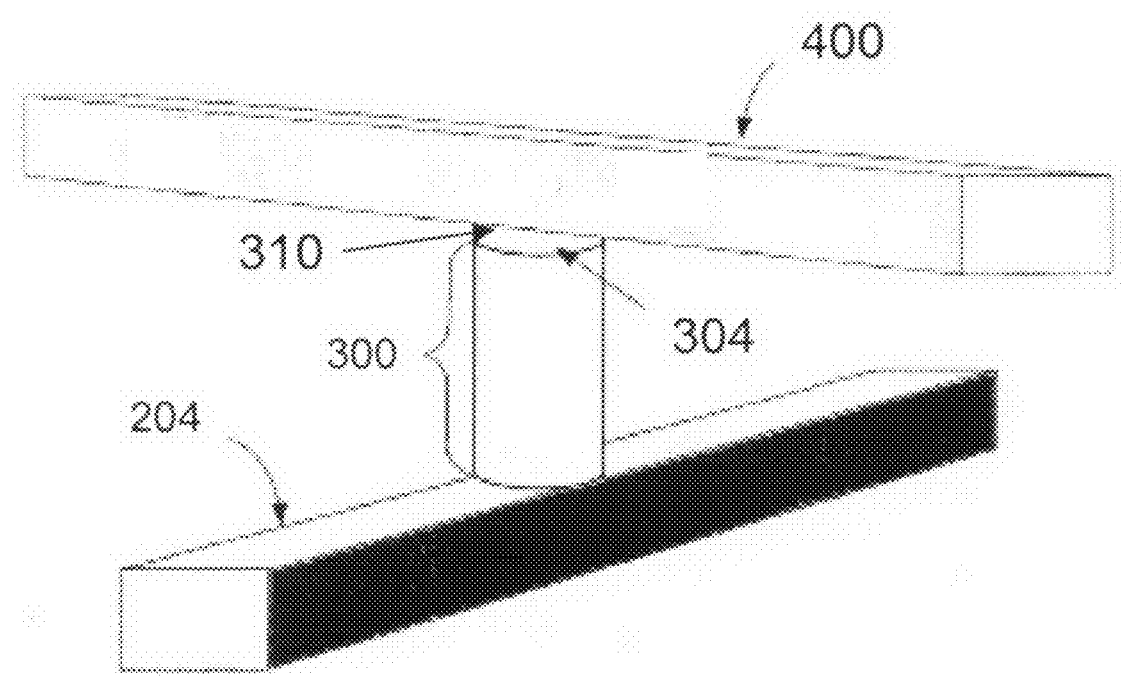
FIG. 1i is a three dimensional view of a completed pillar device according to an embodiment of the present invention.

The pillar device, such as a diode device, may comprise a portion of a one-time programmable (OTP) or re-writable nonvolatile memory device. For example, each diode pillar 300 may act as a steering element of a memory cell and another material or layer 310 which acts as a resistivity switching element or material (i.e., which stores the data) is provided in series with the diode 300, as shown in FIGS. 1h and 1i. The first portion 304 of the conductive layer forms an intermediate conductive layer between the steering element 300 and the switching element 310 of a nonvolatile memory cell, as shown in FIG. 1h. The lower electrode 204 described above functions as the bottom electrode of the memory cell and an additional upper electrode 400 of the memory cell is formed over the switching element 310, as shown in FIG. 1i. Since the conductive layer 304, 306 is formed using the shadow mask, the first portion 304 of the conductive layer located on the bottom of the contact hole 111 does not extend along a sidewall of the contact hole. Thus, the conductive layer does not create short to the upper electrode 400 along the sidewalls of the hole 111 around the resistivity switching element 310.

Specifically, FIG. 1i shows one nonvolatile memory cell which comprises the pillar diode 300 in series with the resistivity switching material 310, such as an antifuse (i.e., antifuse dielectric), fuse, polysilicon memory effect material, metal oxide (such as nickel oxide, perovskite materials, etc,), carbon switchable resistance material (such as graphene, carbon nanotubes, polycrystalline or amorphous carbon, etc.), phase change materials, switchable complex metal oxides, conductive bridge elements, or switchable polymers. The resistivity switching material 310, such as a thin silicon oxide antifuse dielectric layer may be deposited over the diode pillar 300 and the conductive layer portion 304 (which is omitted from FIG. 1i for clarify) by any suitable method, such as CVD, followed by the deposition of the upper electrode 400 on the antifuse dielectric layer. Alternatively, the resistivity switching material 310 may be located below the diode pillar 300, such as between conductive layers 200 and 202. In this embodiment, a resistivity of the resistivity switching material 310 is increased or decreased in response to a forward and/or reverse bias provided between the electrodes 204 and 400.

In another embodiment, the pillar diode 300 itself may be used as the data storage device. In this embodiment, the resistivity of the pillar diode 300 is varied by the application of a forward and/or reverse bias provided between the electrodes 204 and 400, as described in U.S. patent application Ser. No. 10/955,549 filed Sep. 29, 2004 (which corresponds to US Published Application 2005/0052915 A1) and U.S. patent application Ser. No. 11/693,845 filed Mar. 30, 2007 (which corresponds to US Published Application 2007/0164309 A1), both of which are incorporated by reference in their entirety. In this embodiment, the resistivity switching material 310 may be omitted if desired.

The upper electrodes 400 can be formed in the same manner as the bottom electrodes 204, for example by depositing as Ti (bottom)/Al/TiN (top), Ti/TiN/Al/TiN, Ta/Cu/Ta, TiN/Cu, TiN/Cu/TiN or any combination of these layers. The TiN layer on top can serve as an antireflective coating for patterning the conductor and as a polish stop material for subsequent CMP of an insulating layer, as will be described below. The conductive layers described above are patterned and etched using any suitable masking and etching technique to form substantially parallel, substantially coplanar conductor rails 400, extending perpendicular to conductor rails 204. In a preferred embodiment, photoresist is deposited, patterned by photolithography and the layers etched, and then the photoresist removed using standard process techniques. Alternatively, an optional insulating layer, such as a silicon oxide, nitride, or oxynitride layer may be formed on the resistivity switching elements 310 and on the insulating layer 308, and the conductors 400 are formed by a Damascene process, as described above and in U.S. patent application Ser. No. 11/444,936, "Conductive Hard Mask to Protect Patterned Features During Trench Etch," filed May 31, 2006, hereby incorporated by reference in its entirety. If a damascene process is used to form the upper electrode, then an optional etch stop layer may be deposited over the resistivity switching elements 310. The etch stop layer may be removed after formation of the trenches in the insulating layer in which the upper electrodes 400 would be formed.

Formation of a first memory level has been described. Additional memory levels can be formed above this first memory level to form a monolithic three dimensional memory array. In some embodiments, conductors can be shared between memory levels; i.e. top conductor 400 would serve as the bottom conductor of the next memory level. In other embodiments, an interlevel dielectric (not shown) is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays. In contrast to the process described in Leedy, in an embodiment of the present invention, diodes share a conducting wire or electrode between two adjacent layers. In this configuration, the "bottom" diode will "point" in the opposite direction of the diode in the "upper" layer (i.e., the same conductivity type layer of each diode electrically contacts the same wire or electrode located between the diodes). With this configuration, the two diodes can share the wire between them and still not have a read or write disturb issue.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits and fabrication steps are not specifically described, such circuits and protocols are well known, and no particular advantage is afforded by specific variations of such steps in the context of practicing this invention. Moreover, it is believed that one of ordinary skill in the art, equipped with the teaching of this disclosure, will be able to carry out the invention without undue experimentation.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

What is claimed is:

1. A method of making a semiconductor device, comprising:
    forming a pillar shaped semiconductor device surrounded by an insulating layer such that a contact hole in the insulating layer exposes an upper surface of the semiconductor device;
    forming a shadow mask layer over the insulating layer such that a portion of the shadow mask layer overhangs a portion of the contact hole;
    forming a conductive layer such that a first portion of the conductive layer is located on the upper surface of the semiconductor device exposed in the contact hole and a second portion of the conductive layer is located over the shadow mask layer; and
    removing the shadow mask layer and the second portion of the conductive layer.

2. The method of claim 1, wherein:
    the step of forming the shadow mask layer comprises depositing an insulating shadow mask layer by PECVD; and
    the insulating shadow mask layer has a different composition from a composition of the insulating layer.

3. The method of claim 2, wherein the shadow mask layer comprises silicon nitride or BPSG and the insulating layer comprises silicon oxide.

4. The method of claim 1, wherein the step of removing comprises removing the shadow mask layer and the second portion of the conductive layer by CMP or etchback.

5. The method of claim 1, further comprising:
    filling the contact hole with a flowable material prior to the step of removing the shadow mask layer and the second portion of the conductive layer; and
    removing the flowable material after the step of removing the shadow mask layer and the second portion of the conductive layer.

6. The method of claim 1, wherein the semiconductor device comprises a steering element of a nonvolatile memory device.

7. The method of claim 6, wherein the semiconductor device comprises a pillar shaped diode.

8. The method of claim 7, wherein the step of forming the pillar shaped semiconductor device comprises selectively depositing a semiconductor material into an opening in the insulating layer such that a lower portion of opening is filled with the semiconductor material and an unfilled upper portion of the opening forms the contact hole.

9. The method of claim 6, further comprising forming a resistivity switching element in the contact hole over the first portion of the conductive layer.

10. The method of claim 9, wherein the resistivity switching element is selected from antifuse, fuse, polysilicon memory effect cell, metal oxide memory, switchable complex metal oxide, carbon switchable resistance material, phase change material memory, conductive bridge element, or switchable polymer memory.

11. The method of claim 9, further comprising:
    forming a lower electrode below the semiconductor device; and
    forming an upper electrode over the resistivity switching element.

12. The method of claim 1, further comprising performing a chemical wet cleaning step after the step of forming the shadow mask layer.

13. The method of claim 1, wherein the contact hole has a bow shape.

14. The method of claim 1, wherein the step of forming the conductive layer comprises forming a TiN layer by PVD.

15. A method of making a nonvolatile memory device, comprising:
    forming a lower electrode;
    forming an insulating layer;
    forming an opening in the insulating layer to expose at least a portion of the lower electrode;
    forming a pillar shaped diode steering element in the opening in electrical contact with the lower electrode, such that the diode steering element partially fills the opening;
    forming a shadow mask layer over the insulating layer such that a portion of the shadow mask layer overhangs a portion of the opening;
    forming a conductive layer such that a first portion of the conductive layer is located on the upper surface of the diode steering element exposed in the opening and a second portion of the conductive layer is located over the shadow mask layer;
    removing the shadow mask layer and the second portion of the conductive layer;
    forming a resistivity switching element in the opening over the first portion of the conductive layer; and forming an upper electrode over the resistivity switching element.

16. The method of claim 15, wherein:

the step of forming the shadow mask layer comprises depositing an insulating shadow mask layer by PECVD, the insulating shadow mask has a different composition from a composition of the insulating layer; and the step of forming the pillar shaped diode comprises selectively depositing a polycrystalline or amorphous semiconductor diode material into the opening.

17. The method of claim 16, wherein:

the shadow mask layer comprises silicon nitride or BPSG;

the insulating layer comprises silicon oxide;

the conductive layer comprises a TiN layer formed by PVD;

the resistivity switching element is selected from antifuse, fuse, diode and antifuse arranged in a series, polysilicon memory effect cell, metal oxide memory, switchable complex metal oxide, carbon switchable resistance material, phase change material memory, conductive bridge element, or switchable polymer memory; and the step of removing comprises removing the shadow mask layer and the second portion of the conductive layer by CMP or etchback.

18. The method of claim 15, further comprising:

filling the opening with a flowable material after a step of forming the conductive layer and prior to a step of removing the shadow mask layer and the second portion of the conductive layer; and removing the flowable material after the step of removing the shadow mask layer and the second portion of the conductive layer.

19. The method of claim 15, wherein the first portion of the conductive layer does not extend along a sidewall of the opening.

20. A method of making a nonvolatile memory device, comprising:

forming a lower electrode;

forming a silicon oxide insulating layer;

forming an opening in the insulating layer to expose at least a portion of the lower electrode;

selectively depositing a pillar shaped semiconductor diode steering element in the opening in electrical contact with the lower electrode, such that the diode steering element partially fills the opening;

forming a BPSG or silicon nitride shadow mask layer by PECVD over the insulating layer such that a portion of the shadow mask layer overhangs a portion of the opening;

forming a TiN conductive layer such that a first portion of the conductive layer is located on the upper surface of the diode steering element exposed in the opening and a second portion of the conductive layer is located over the shadow mask layer;

filling the opening with a flowable material after a step of forming the TiN conductive layer;

removing the shadow mask layer and the second portion of the conductive layer by CMP;

removing the flowable material after the step of removing the shadow mask layer and the second portion of the conductive layer;

forming a resistivity switching element in the opening over the first portion of the conductive layer; and forming an upper electrode over the resistivity switching element.

* * * * *